United States Patent
Lenz (12) 
(10) Patent No.: US 6,788,080 B1
(45) Date of Patent: Sep. 7, 2004

(54) TEST PROBE ASSEMBLY FOR CIRCUITS, CIRCUIT ELEMENT ARRAYS, AND ASSOCIATED METHODS

(76) Inventor: Seymour Lenz, 122 E. Lake Ave., Longwood, FL (US) 32750

( * ) Notice: Subject to any disclaimer, the term of this patent is extended or adjusted under 35 U.S.C. 154(b) by 0 days.

(21) Appl. No.: 10/439,087

(22) Filed: May 15, 2003

(51) Int. Cl.$^7$ .............................................. G01R 31/02
(52) U.S. Cl. ........................ 324/754; 324/761; 324/762
(58) Field of Search ................................ 324/754, 761, 324/762, 158.1, 73.1, 765

(56) References Cited

U.S. PATENT DOCUMENTS

| | | | |
|---|---|---|---|
| 3,812,311 A | * 5/1974 | Kvaternik | ................. 200/61.42 |
| 4,035,723 A | * 7/1977 | Kvaternik | ..................... 324/754 |
| 4,116,523 A | * 9/1978 | Coberly et al. | ............. 439/578 |
| 4,151,465 A | 4/1979 | Lenz | |
| 4,177,425 A | 12/1979 | Lenz | |
| 4,618,821 A | 10/1986 | Lenz | |
| 4,965,865 A | 10/1990 | Trenary | |
| 4,973,903 A | 11/1990 | Schemmel | |
| 5,720,098 A | 2/1998 | Kister | |
| 5,883,519 A | 3/1999 | Kennedy | |
| 6,127,832 A | * 10/2000 | Comulada et al. | .......... 324/754 |
| 6,489,795 B1 | 12/2002 | Klele et al. | |

* cited by examiner

*Primary Examiner*—Evan Pert
*Assistant Examiner*—Tung X. Nguyen (57) ABSTRACT

The test probe includes two arms, each having a front portion with a slot therethrough and a downwardly extending tip terminating in a probe end for contacting a test circuit. The first arm's tip is shorter than that of the second arm. A rear portion is affixable to a retaining block. A central portion includes an arm for connection with the circuit. The arms are commonly oriented with the second arm above and generally coplanar with the first arm in a first plane. The probe ends are generally coplanar in a second plane generally perpendicular to the first plane. Typically an assembly includes a first plurality of arms, affixed in stacked relation in a retaining block, and a second plurality of arms, affixed in stacked relation in the retaining block in opposite orientation to the first plurality, with multiple levels of arms extending parallel to the arm plane.

24 Claims, 6 Drawing Sheets

TEST PROBE ASSEMBLY FOR CIRCUITS, CIRCUIT ELEMENT ARRAYS, AND ASSOCIATED METHODS

BACKGROUND OF THE INVENTION

1. Field of the Invention

The present invention relates to circuit testing devices and methods and, more particularly, to such devices and methods for high-density circuits, test pin arrays, and multiple-row ball grid arrays.

2. Description of Related Art

Test probes for use in testing electronic circuitry are known in the art to comprise one or more elongated arms having a downwardly depending, typically pointed, electrically conductive distal tip for contacting a portion of the circuit. The inventor of the present application has disclosed test probes and assemblies in U.S. Pat. Nos. 4,151,465; 4,177,425; 4,618,821; and 6,489,795, the contents of which are incorporated herein by reference.

It is known to be preferable for the probe arm to have a certain amount of flexibility for permitting reproducible and nondamaging contact with the circuit. Exemplary flexure means are disclosed in the '465 and '821 patents. Other such probes are disclosed in U.S. Pat. Nos. 4,973,903; 4,965,865; 5,720,098; and 5,883,519.

SUMMARY OF THE INVENTION

The present invention is directed to a test probe for testing microcircuits. The test probe comprises a torsion head blade contact that provides a capability of fabricating probe assemblies and test sockets capable of probing high-density circuits, test pin arrays, or multi-row ball grid arrays.

The probe for testing circuits of the present invention has improved flexibility and has a longer lifespan and durability. The test probe comprises a first and a second elongated, generally planar, electrically conductive arm member. Each of the first and the second arm members have a pair of generally planar and parallel side surfaces extending along a longitudinal axis in a first plane. A front portion has an elongated slot extending through the arm between the side surfaces and comprises a downwardly extending tip terminating in a probe end for contacting a circuit to be tested. The tip of the first arm member is shorter than the tip of the second arm member.

A rear portion of each arm member is movably affixable to a retaining block. A central portion positioned between the front portion and the rear portion comprises means for connecting to a test circuit.

The first and the second arm members are relatively positioned in commonly oriented fashion with the second arm member above and generally coplanar with the first arm member in the first plane. The probe ends of the first and the second arm members are generally coplanar in a second plane generally perpendicular to the first plane.

Typically the test probe is part of an assembly comprising a first plurality of such test probes, affixed in stacked relation in a retaining block, and a second plurality of such test probes, affixed in stacked relation in the retaining block in opposite orientation to the first plurality.

The test probe of the present invention allows for two electrically isolated probes to be placed side by side, allowing for two probes to be placed on each pad or solder ball for true Kelvin probing, for example. Multiple Kelvin probes are then usable in-line in a single block probe assembly. Multiple probes, each electrically isolated from each other, can be positioned in a unitary retainer block.

The features that characterize the invention, both as to organization and method of operation, together with further objects and advantages thereof, will be better understood from the following description used in conjunction with the accompanying drawing. It is to be expressly understood that the drawing is for the purpose of illustration and description and is not intended as a definition of the limits of the invention. These and other objects attained, and advantages offered, by the present invention will become more fully apparent as the description that now follows is read in conjunction with the accompanying drawing.

DETAILED DESCRIPTION OF THE PREFERRED EMBODIMENTS

A description of the preferred embodiments of the present invention will now be presented with reference to FIGS. 1A–7.

Figure 1A:
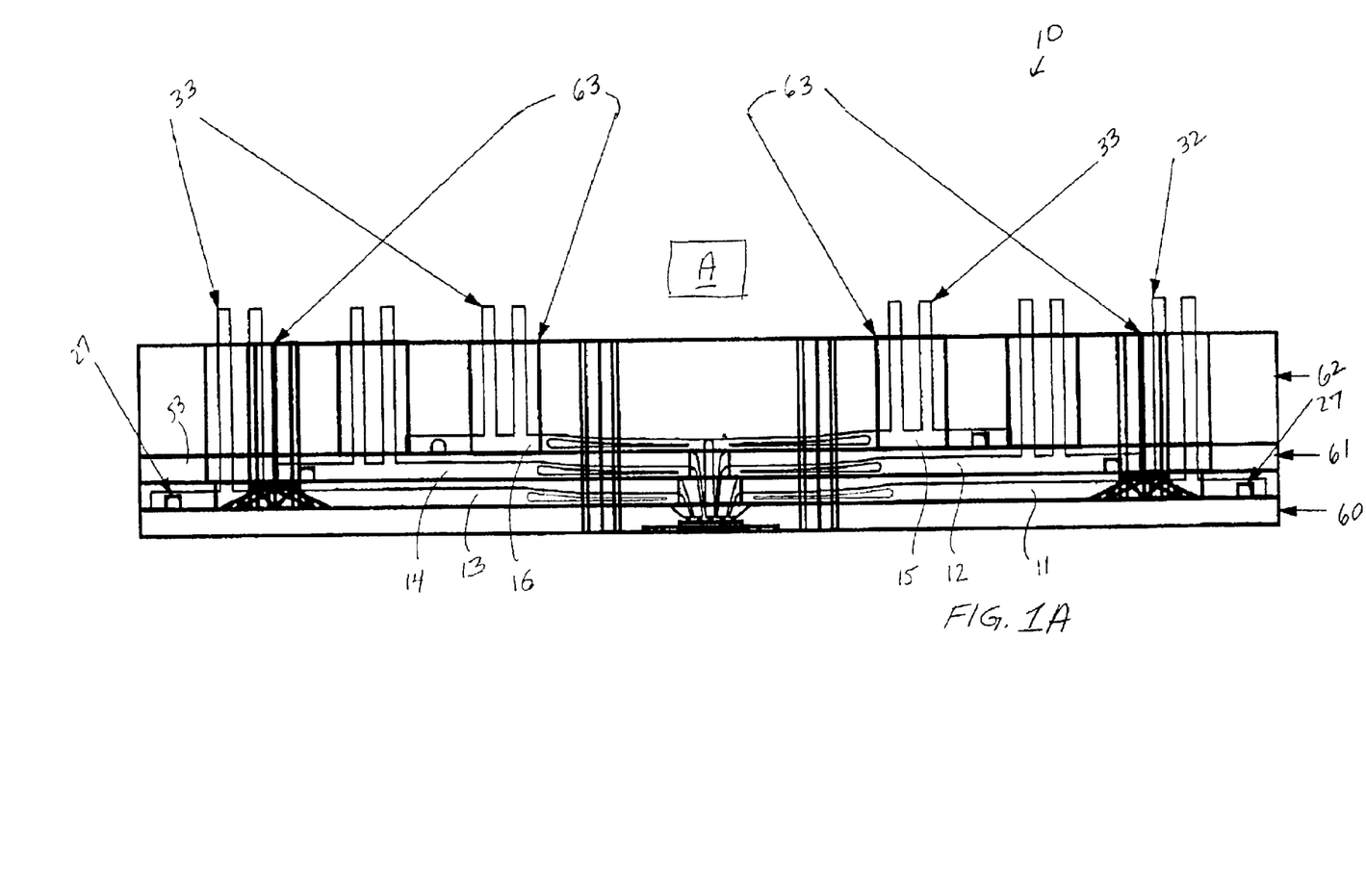
FIGS. 1A and 1B are side views of a Kelvin test probe assembly comprising 72 arm members (visible are six arm members across, and there are 12 deep behind each of the six visible arm members) positioned within retainer blocks, the probe ends positioned atop a socket, FIG. 1B being a magnified view of the probe end and chip area.
Figure 1B:
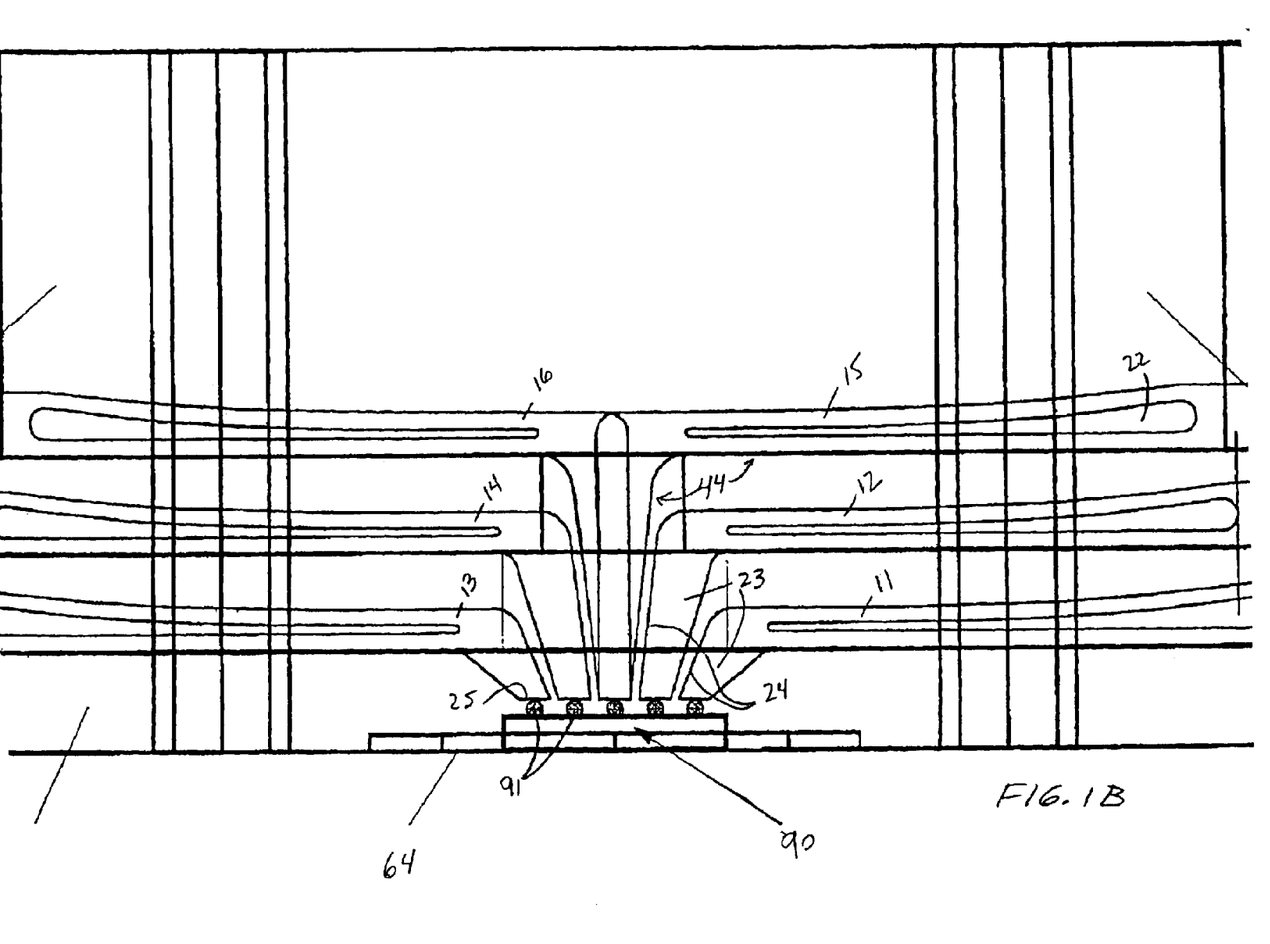
Figures 2, 3, 4:
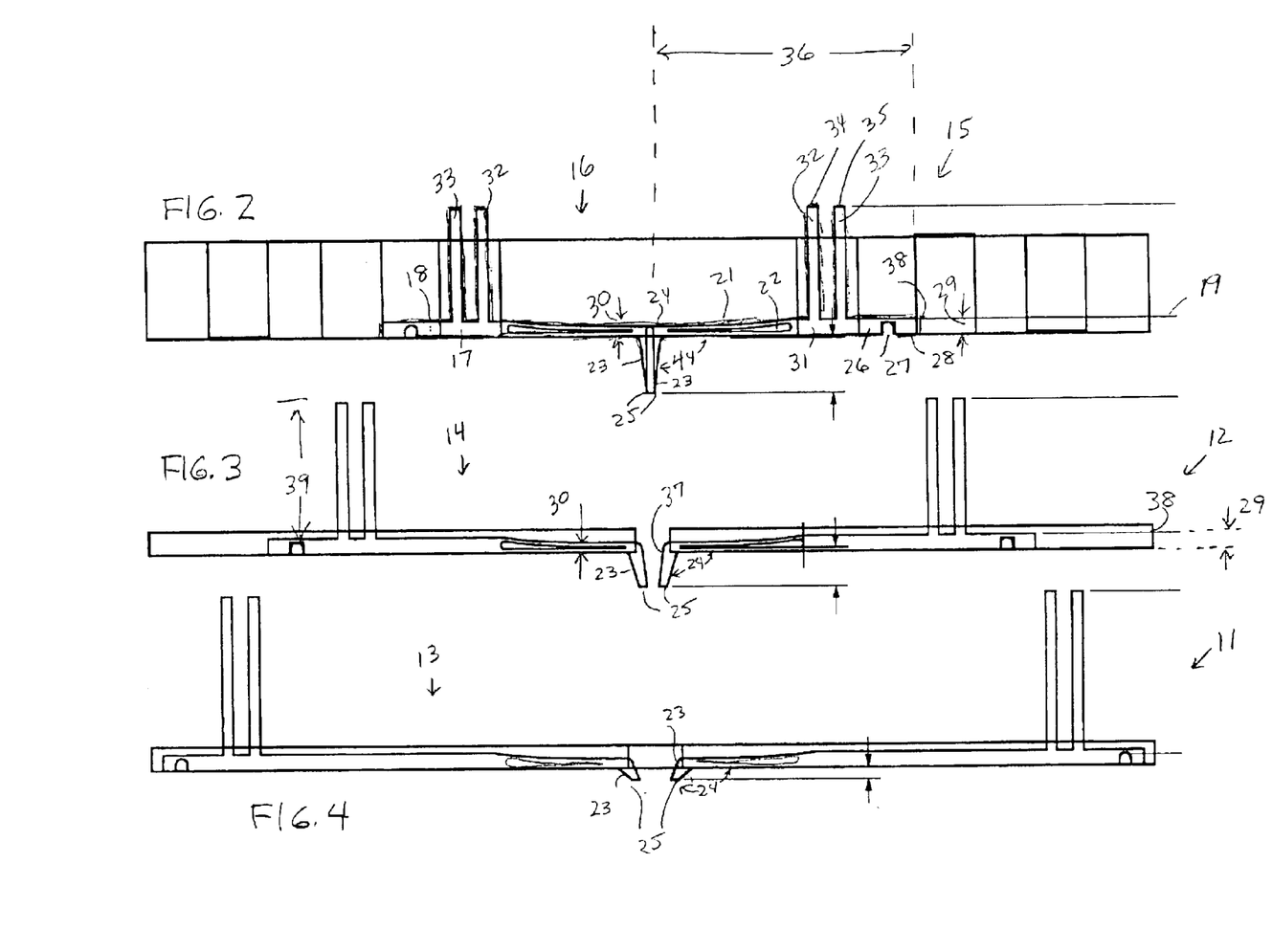
FIG. 2 is a side view of a pair of first arm members of the present invention mounted within slots in the first retainer block.
FIG. 3 is a side view of a pair of second arm members mounted within slots in the second retainer block.
FIG. 4 is a side view of a pair of third arm members mounted within slots in the third retainer block.
Figure 5:
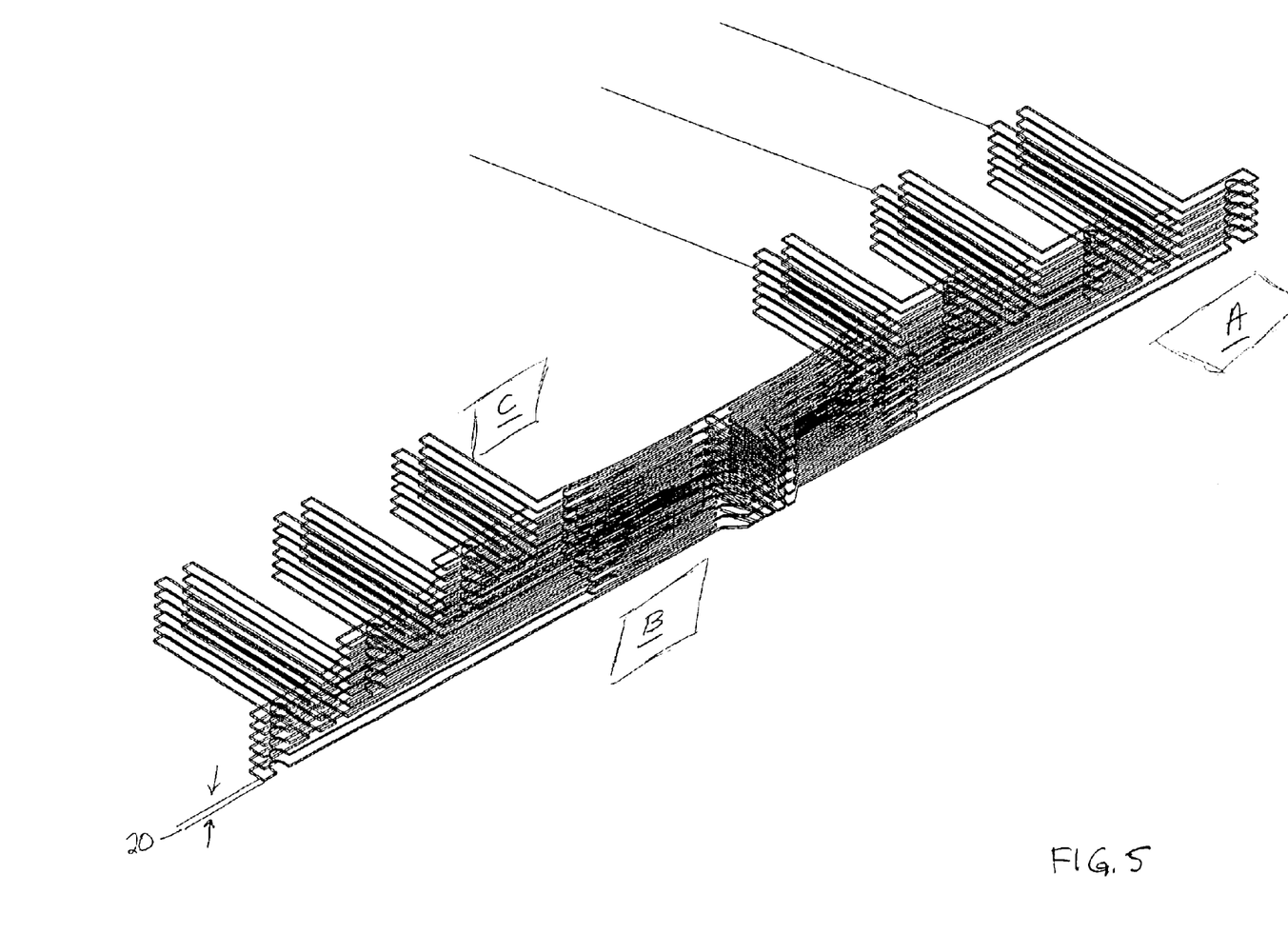
FIG. 5 is a top-side view of a test probe device comprising thirty test probes used in an embodiment comprising a 6×12 ball grid array kelvin test socket.

The test probe assembly 10, shown in side view in FIGS. 1A and 1B, comprises a plurality of unitary test probes (FIGS. 2–4), up to six test probes 11–16, arrayed in generally coplanar fashion in a first plane A. Each test probe 11–16 comprises an elongated electrically conductive arm that has a pair of generally planar and parallel side surfaces 17,18 that extend along a longitudinal axis 19. Preferably each probe 11–16 has a generally constant width 20 (FIG. 5) between the side surfaces 17,18. In an exemplary embodiment the width 20 between the side surfaces is approximately 0.003–0.010 in.

A front portion 21 of each test probe 11–16 has an elongated slot 22 extending through the arm between the side surfaces 17,18. The front portion slot 22 is adapted to provide flexure in the first plane A. The front portion 21 also comprises a downwardly extending tip 23 at a front end 24 terminating in a probe end 25 for contacting a solder ball or circuit pad to be tested. The tips 23 of the first 11 and the third 13 arm members are generally equal in length, and are shorter than the tips 23 of the second 12 and the fourth 14 arm members, which are also generally equal in length. The tips 23 of the second 12 and the fourth 14 arm members are in turn shorter than the tips 23 of the fifth 15 and the sixth 16 arm members, which are also generally equal in length.

The tip 23 meets the front portion 21 at a tip angle 44. The generally equal tip angles 44 of the first 11 and the third 13 arm members are greater than the generally equal tip angles 44 of the second 12 and the fourth 14 arm members. The tip angles 44 of the second 12 and the fourth 14 arm members are in turn greater than the generally equal tip angles 44 of the fifth 15 and the sixth 16 arm members. The tip angles 44 are all in a range between 97 and 150 degrees.

The lengths and the tip angles 44 of the probes 11–16 are configured so that the probe ends 25 are generally coplanar in a second plane B that is generally perpendicular to the first plane A.

Figure 6:
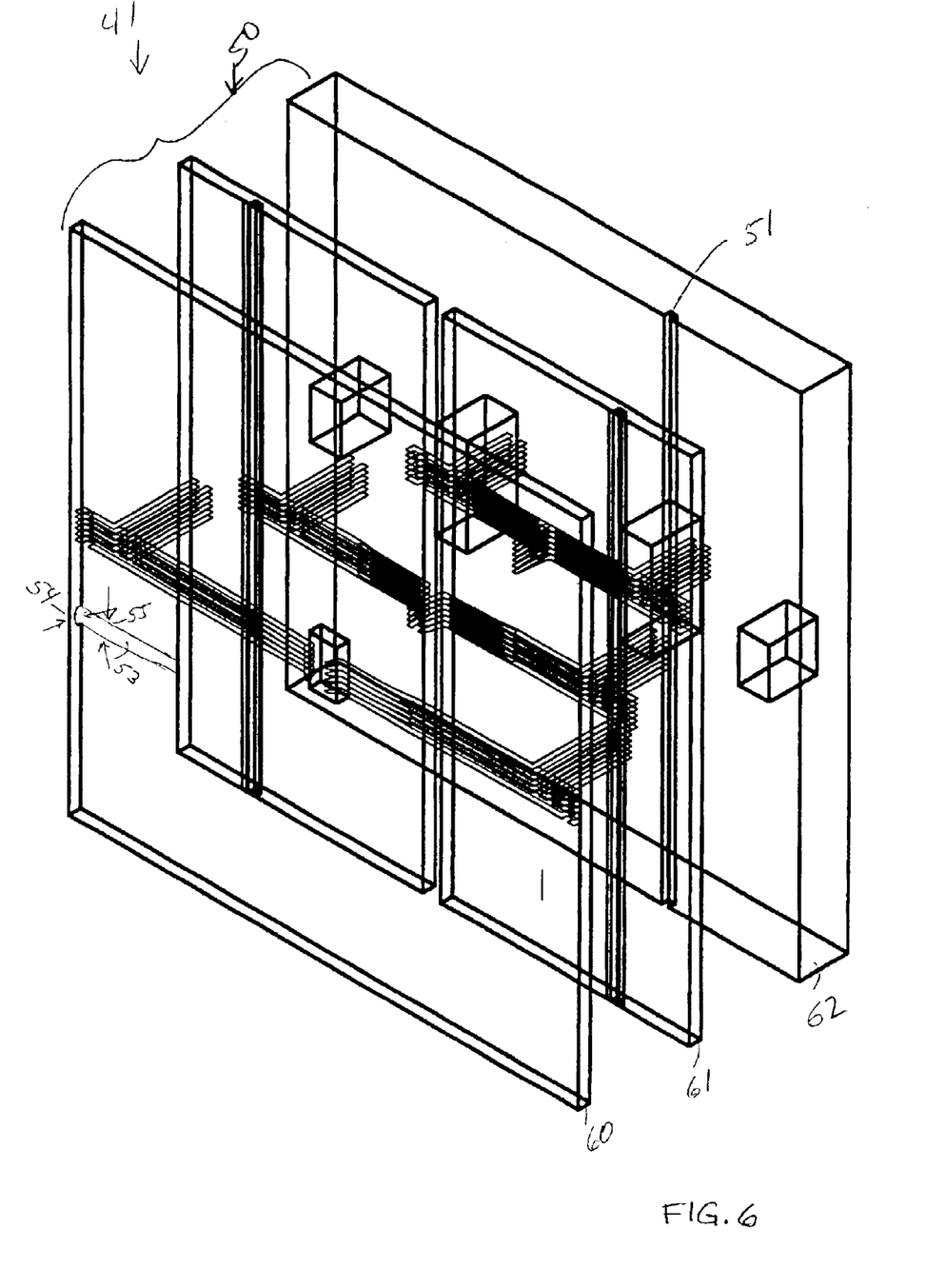
FIG. 6 is an exploded view of the retainer blocks having the arm members mounted therein.
Figure 7:
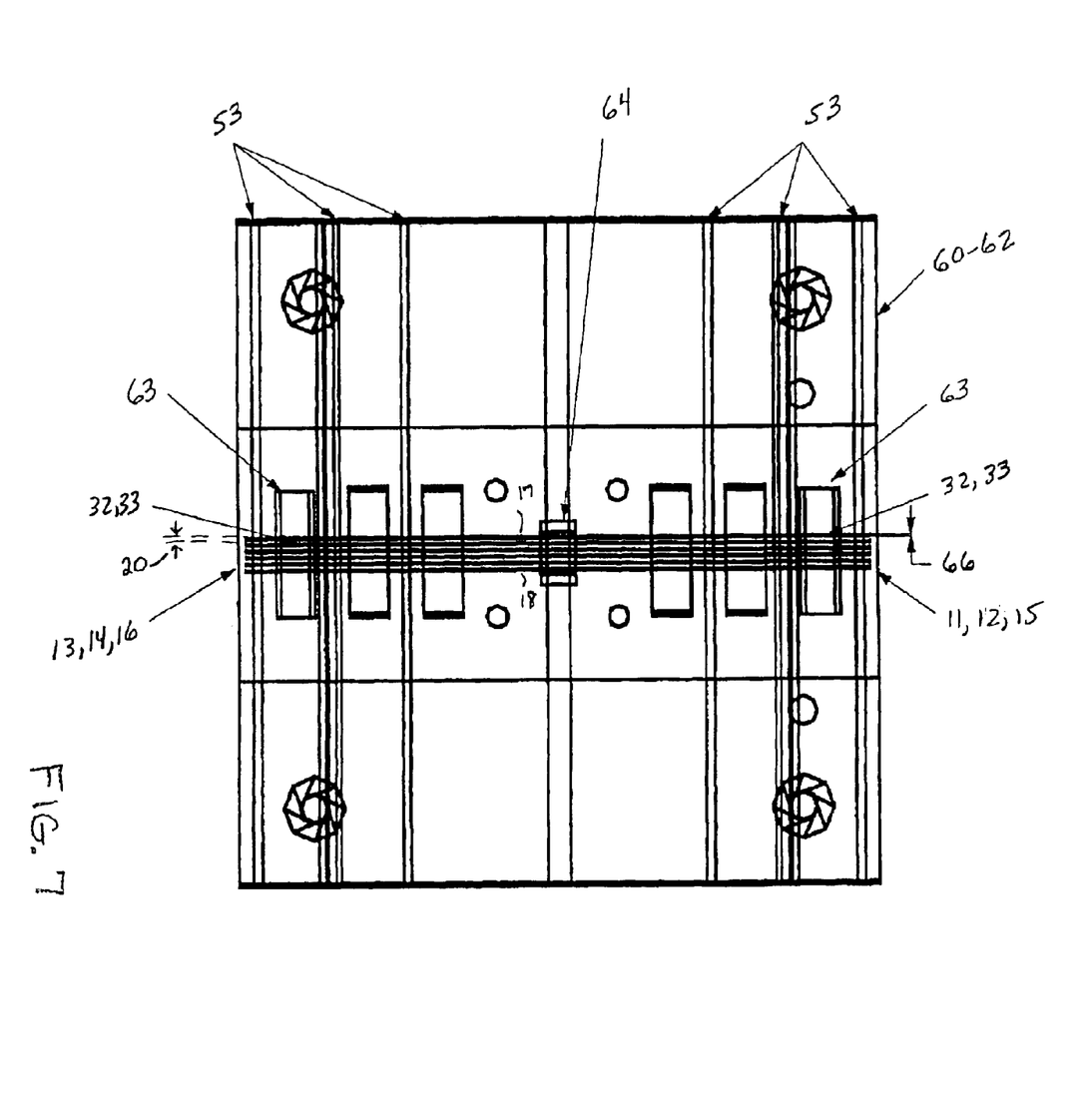
FIG. 7 is a top plan view (plane B) of the 6×12 ball grid array kelvin test socket.

Each test probe 11–16 has a rear portion 26 that is movably affixable to a retaining block 41 (FIGS. 6 and 7). The rear portion 26 has a cutout 27 along a bottom edge 28 for permitting horizontal positioning to fit the pads being probed within the first plane A against a rod member 51 in the retaining block 50. When positioned in the device 41, the cutouts 27 of the arm members 11–16, respectively, are generally collinear. The rear portion 26 has a height 29 greater than a height 30 of the front portion 21.

A central portion 31 of each test probe 11–16 is positioned between the front portion 21 and the rear portion 26. The central portion 31 comprises means for connecting to a lead wire to a test circuit. In a preferred embodiment, the connecting means comprises a pair of generally parallel, spaced-apart, upwardly extending arms 32,33. Each of the arms 32,33 has an upper end 34,35, which when assembled are generally coplanar in a third plane C generally parallel to the second plane B. Preferably one arm is trimmed away, and the opposite arm is trimmed off on the adjacent probe to allow room for wires to be soldered.

Each of the arms 11–16 preferably comprises a conductive metal, for example, a beryllium copper alloy, although this is not intended as a limitation.

When assembled for use, the first 11, the second 12, and the fifth 15 arm members are relatively positioned in commonly oriented, cascaded fashion with the second arm member 12 above and generally coplanar with the first arm member 11 in the first plane A and the fifth arm member 15 above and generally coplanar with the first arm member 11 in the first plane A. Further, the third 13, the fourth 14, and the sixth 16 arm members are relatively positioned in commonly oriented, cascaded fashion with the fourth arm member 14 above and generally coplanar with the third arm member 13 in the first plane and the sixth arm member 16 above and generally coplanar with the third arm member 13 in the first plane. The third 13, the fourth 14, and the sixth 16 arm members may be positioned oppositely oriented or offset to the first 11, the second 12, and the fifth 15 arm members, as required by the device under test (DUT). The tip 23 of the fifth arm member 15 is closely adjacent the tip 23 of the sixth arm member 16, for example, as close as 0.001 in.

The lengths 36 of the arm members 11–16 between a front edge 24 and a rear edge 38 are graduated from top to bottom in order to permit a staggering of the connecting arms 32,33. The fifth 15 and the sixth 16 are the shortest at an exemplary length of 0.708 in.; the second 12 and the fourth 14 are next, with an exemplary length of 0.985 in.; the first 11 and the third 13 are the longest, with an exemplary length of 1.240 in. Similarly, the lengths 35 of the connecting arms are graduated so that their ends 34,35 are coplanar. The lengths 39 of the fifth 15 and the sixth 16 are the shortest at an exemplary length of 0.290 in.; the second 12 and the fourth 14 are next, with an exemplary length of 0.350 in.; the first 11 and the third 13 are the longest, with an exemplary length of 0.410 in.

Preferably the test probe device 41 comprises a plurality of test probe assemblies 10 arrayed with the first planes A generally parallel and the second planes B generally coplanar (FIGS. 6 and 7). An exemplary spacing 66 between layers of arm members 11–16 is 0.003 in., although this is not intended as a limitation. The test probes 11–16 can be fabricated from a flat sheet of conductive material.

In use, the test probe ends 25 of the test probes 11–16 are placed in contact with a solder ball 91 or DUT pads atop a chip 90, and the connecting arms 32,33 are placed in contact with lead wires for the test electronics. A measurement can then be performed based on signals transmitted from the tips to the test circuit.

The assembly 41 comprises a plurality of retainer blocks 60–62 (see the exploded view of FIG. 6) to form the device 41. The retainer blocks 60–62 may comprise, for example, thermoplastic or an insulating material. Slots 53 have a depth 54 substantially the same as the arm height 29 and a greater width 55 than that 20 of the arms 11–16. The flexure of the arm 11–16 permits the probe ends 25 to planarize to irregularities in the surface of the pads or solder balls being tested. In addition, controlled flexure of the arms 11–16 provides calculated pressures to the probe ends 25, ensuring good electrical contact. The retainer blocks 60–62 have windows 63 therein for permitting access to the connecting arms 32,33 and also a window 64 for permitting access to the circuit 90 to be tested.

The device 41 is adapted to probe circuit pads, terminals, solder balls, etc., that are in-line having center-to-center spacings greater than or equal to 0.003 in. Retainer blocks 60–62 are fabricated to allow for probing from one to four sides of a circuit, or on any other nonstandard configuration.

Further, the arms 11–16 may be modified to allow them to be stepped in or out in order to probe on circuits or pads that are not in-line, simply by cutting additional alignment rod slots that will allow for the probes to be indexed forward or backward in the mounting slot. Arms 11–16 may also be mounted into radial slots cut around the periphery of a center hole in a retainer block plate to enable 360° probing.

The mounting of the arms 11–16 will now be described. Arms 11,13 are mounted into a first thin retainer block 60 that is slightly thicker than the arm height 29. The probe ends 25 of this row of probes will touch down on the first row of pads or circuitry to be probed. A second thin retainer block 61 can then be mounted on top of the first retainer block 60 to allow the tips 23 of arms 12,14, which are longer, to project slightly forward of the probe ends 25 of arms 11,13. The tips 23 of arms 12,14 will then cascade over tips 23 of arms 11,13, and the probe ends 25 of arms 12,13 will protrude down to the next inner row of circuits or pads being probed, just ahead of the probe ends 25 of arms 11,13 making electrically isolated contact with the surface being probed.

Likewise, arms 15,16, mounted on block 62, are designed with longer bodies to allow the tips 23 to cascade over the bps of arms 11,13 and 12,14, making electrically isolated contact with the third inner row pad, solder ball, or circuit surface to be probed. The tips 23 are held into front/back alignment with a nonconductive alignment rod that runs through the cutouts 27 in each of the arms 11,16. The three block retainers 60–62 are held in position relative to each other using dowel pins through some or all of the retainer blocks 60–62. Additional cascade probe designs allow for more electrically isolated rows to be probed simultaneously.

A particular application of the present invention is in the fabrication of true Kelvin test sockets for probing, testing, and burn-in testing of circuits or multichip modules using ball grid array terminations. Solder bumps 91 on these types of multichip modules are generally very small, ranging from 0.007 to 0.010 in. in diameter and spaced 0.010–0.020 in. apart or wider. Test or burn-in sockets can be fabricated to place two probes on each solder bump in the array by using the design of the present invention by using multiple levels of dual retainer blocks, which probe from two sides, with the probes of the present invention mounted on each level.

Similar test or burn-in sockets or probe assemblies may be fabricated using single, triple, or quad (four-sided) block probe assemblies, as well as irregular or circular layouts. Once the multilevel probe assemblies are fabricated, a nest plate is mounted over the protruding probe tips to guide the device being tested into position as it is placed on top of the probes. A hinged cover plate is then lowered to allow a push screw mounted on the cover plate to press the device under test down onto the probes to enable good electrical contact. A lock mechanism then holds the lid down while testing. In this use, the assembly as shown would be "upside down," with the tips pointing upward.

High-density probe cards can also be fabricated using the design of the present invention. A similar type of probe assembly as described above is assembled and mounted, probes facing down, to the bottom of a probe card or printed wiring board. Likewise, the probe assembly may be mounted to any other type of holding fixture, such as a flying head probe, or movable probe head. The probe of the present invention now allows for multirow testing of any device that requires the use of the arm probe (contact) design.

The present invention can also be used in an application for interleaved high-density probe assemblies. When the surfaces to be probed, be they pads, solder balls, conductors, etc., require a gap of approximately 0.001 in. between adjacent probes that are electrically isolated, the assembly 41 can be used. The first row of pads or solder balls can be probed with two electrically isolated probes 0.001 in. apart, by, for example, arm 11 from the first retainer block. The second probe will be that from the second block mounted atop the first block that is slotted such that the tip of the probe 12 will also touch down on the same pad conductor or solder ball as that of the arm 11. The slots in the second block will be shifted over from the slots in the first block below it to provide the 0.001-in. or more gap between the two probes 11,12.

In the foregoing description, certain terms have been used for brevity, clarity, and understanding, but no unnecessary limitations are to be implied therefrom beyond the requirements of the prior art, because such words are used for description purposes herein and are intended to be broadly construed. Moreover, the embodiments of the apparatus illustrated and described herein are by way of example, and the scope of the invention is not limited to the exact details of construction.

Having now described the invention, the construction, the operation and use of preferred embodiment thereof, and the advantageous new and useful results obtained thereby, the new and useful constructions, and reasonable mechanical equivalents thereof obvious to those skilled in the art, are set forth in the appended claims.

What is claimed is:

1. A test probe comprising:
   a first and a second elongated, generally planar, electrically conductive arm member, each of the first and the second arm member having:
   a pair of generally planar and parallel side surfaces extending along a longitudinal axis in a first plane;
   a front portion having an elongated slot extending through the arm member between the side surfaces and comprising a downwardly extending tip at a front end terminating in a probe end for contacting a circuit to be tested, the tip of the first arm member shorter than the tip of the second arm member;
   a rear portion movably affixable to a retaining block; and
   a central portion positioned between the front portion and the rear portion comprising means for connecting to a test circuit;
   wherein the first and the second arm members are relatively positioned in commonly oriented fashion with the second arm member above and generally coplanar with the first arm member in the first plane, the probe ends of the first and the second arm members generally coplanar in a second plane generally perpendicular to the first plane.

2. The test probe recited in claim 1, wherein the connecting means comprises a pair of generally parallel, upwardly extending arms.

3. The test probe recited in claim 2, wherein the arms each have an upper end, the upper ends of the arms of the first and the second arm member generally coplanar in a third plane generally parallel to the second plane.

4. The test probe recited in claim 1, wherein the rear portion has a cutout along a bottom edge for permitting horizontal placement within the first plane against a rod member in the retaining block.

5. The test probe recited in claim 1, wherein the rear portion has a height greater than a height of the front portion.

6. The test probe recited in claim 1, wherein the tip meets the front portion at a tip angle, the tip angle of the first arm member greater than the tip angle of the second arm member.

7. The test probe recited in claim 6, wherein the tip angle is in a range between 90 and 135 degrees.

8. The test probe recited in claim 1, wherein the arm comprises one of a nonconductive material coated with a conductive material or a solid conductive material.

9. The test probe recited in claim 8, wherein the conductive material comprises a beryllium copper alloy.

10. The test probe recited in claim 1, further comprising a third and a fourth elongated, generally planar, electrically conductive arm member, each of the third and the fourth arm member having:
   a pair of generally planar and parallel side surfaces extending along a longitudinal axis in the first plane;
   a front portion having an elongated slot extending through the arm member between the side surfaces, and comprising a downwardly extending tip at a front end terminating in a probe end for contacting a circuit to be tested, the tip of the first arm member shorter than the tip of the second arm member, the slot permitting the tip to flex thereinto;
   a rear portion movably affixable to a retaining block; and
   a central portion positioned between the front portion and the rear portion comprising means for connecting to a test circuit;
   wherein the third and the fourth arm members are relatively positioned in commonly oriented fashion with the fourth arm member above and generally coplanar with the third arm member in the first plane, the probe ends of the third and the fourth arm members generally coplanar in the second plane, the third and the fourth arm members positioned oppositely oriented to the first and the second arm members, the tip of the second arm member adjacent the tip of the fourth arm member.

11. The test probe recited in claim 1, wherein a width between the side surfaces is approximately 0.003–0.010 in., and a length between a rear edge and the front edge is in a range of approximately 0.708–1.240 in.

12. The test probe recited in claim 1, wherein the front portion slot is adapted to provide flexure in the first plane.

13. A test probe device comprising a generally planar arm member assembly comprising:
   a first, a second, a third, a fourth, a fifth, and a sixth elongated, generally planar, electrically conductive arm member, each arm member having:
      a pair of generally planar and parallel side surfaces extending along a longitudinal axis in a first plane;
      a front portion having an elongated slot extending through the arm member between the side surfaces and comprising a downwardly extending tip terminating in a probe end for contacting a circuit to be tested, the tip of the first and the third arm member shorter than the tip of the second and the fourth arm member, the tip of the second and the fourth arm member shorter than the tip of the fifth and the sixth arm member;
      a rear portion movably positionable within a slot in a retaining block; and
      a central portion positioned between the front portion and the rear portion comprising means for connecting to a test circuit;
   wherein the first, the second, and the fifth arm members are relatively positioned in commonly oriented fashion with the second arm member above and generally coplanar with the first arm member in the first plane, the fifth arm member above and generally coplanar with the first arm member in the first plane, the third, the fourth, and the sixth arm members are relatively positioned in commonly oriented fashion with the fourth arm member above and generally coplanar with the third arm member in the first plane, the sixth arm member above and generally coplanar with the third arm member in the first plane, the third, the fourth, and the sixth arm members positioned oppositely oriented to the first, the second, and the fifth arm members, the Up of the fifth arm member adjacent the tip of the sixth arm member, the probe ends of the arm members generally coplanar in a second plane generally perpendicular to the first plane.

14. The test probe device recited in claim 13, wherein the connecting means comprises a pair of generally parallel, upwardly extending arms.

15. The test probe device recited in claim 14, wherein the arms each have an upper end, the upper ends of the arms of the arm members generally coplanar in a third plane generally parallel to the second plane.

16. The test probe device recited in claim 13, wherein the rear portion has a cutout along a bottom edge for locking the probe within the first plane against a rod member in the retaining block.

17. The test probe device recited in claim 13, wherein the rear portion has a height greater than a height of the front portion.

18. The test probe device recited in claim 13, wherein the tip meets the front portion at a tip angle, the tip angle of the first and the third arm members greater than the tip angle of the second and the fourth arm members, the tip angle of the second and the fourth arm members greater than the tip angle of the fifth and the sixth arm members.

19. The test probe device recited in claim 18, wherein the tip angle is in a range between 97 and 150 degrees.

20. The test probe device recited in claim 13, wherein the arm comprises one of a nonconductive material coated with a conductive material or a solid conductive material.

21. The test probe device recited in claim 20, wherein the conductive material comprises a beryllium copper alloy.

22. The test probe device recited in claim 13, further comprising a plurality of test probe assemblies arrayed with the first planes generally parallel and the second planes generally coplanar.

23. The test probe device recited in claim 22, wherein the rear portion has a cutout along a bottom edge for locking the probe within the first plane against a rod member in the retaining block, the cutouts of the first, the second, the third, the fourth, the fifth, and the sixth arm members, respectively, generally collinear.

24. A method of testing a microcircuit comprising the steps of:
   providing a test probe comprising a first and a second elongated, generally planar, electrically conductive arm member, each of the first and the second arm member having:
      a pair of generally planar and parallel side surfaces extending along a longitudinal axis in a first plane;
      a front portion having an elongated slot extending through the arm member between the side surfaces and comprising a downwardly extending tip at a front end terminating in a probe end for contacting a circuit to be tested, the tip of the first arm member shorter than the tip of the second arm member;
      a rear portion movably affixable to a retaining block; and
      a central portion positioned between the front portion and the rear portion comprising means for connecting to a test circuit;
   wherein the first and the second arm members are relatively positioned in commonly oriented fashion with the second arm member above and generally coplanar with the first arm member in the first plane, the probe ends of the first and the second arm members generally coplamar in a second plane generally perpendicular to the first plane,
   connecting the connecting means of the test probe to a test circuit;
   contacting the test probe ends to a first and a second portion of a circuit to be tested; and
   performing a measurement based on signals transmitted from the tips to the test circuit.

* * * * *